United States Patent [19]

Hogeboom

[11] 4,233,528
[45] Nov. 11, 1980

[54] SAMPLE-AND-HOLD CIRCUIT WITH CURRENT GAIN

[75] Inventor: John G. Hogeboom, Ottawa, Canada

[73] Assignee: Northern Telecom Limited, Montreal, Canada

[21] Appl. No.: 953,452

[22] Filed: Oct. 23, 1978

[51] Int. Cl.³ .................. G11C 27/02; H03K 17/56
[52] U.S. Cl. ........................ 307/353; 307/253; 328/151
[58] Field of Search ............ 307/352, 353, 253–255; 328/151

[56] References Cited

U.S. PATENT DOCUMENTS

| | | | |
|---|---|---|---|
| 3,471,719 | 10/1969 | Hughes | 307/255 X |
| 3,638,045 | 1/1972 | Hughes | 307/267 |
| 3,675,135 | 7/1972 | Weller | 328/151 |
| 3,716,800 | 2/1973 | Di Rocco | 328/151 |
| 3,764,921 | 10/1973 | Huard | 328/151 |
| 3,959,732 | 5/1976 | Schaefer | 307/353 X |

Primary Examiner—John Zazworsky
Attorney, Agent, or Firm—Robert C. Hogeboom

[57] ABSTRACT

The subject invention is a sample-and-hold circuit that provides current gain and that is suitable for construction according to LSI (large scale integration) techniques. The circuit incorporates a bipolar transistor biased on (in the "sample" mode) to a predetermined quiescent state. A capacitor is connected across the output of the circuit (i.e. across the output of the bipolar transistor) to be charged to a certain voltage by the bipolar transistor and to store this voltage when the sample-and-hold circuit is in the "hold" mode of operation. IGFETs (insulated gate field effect transistors) are employed to bias the bipolar transistor and to switch the circuit from one mode of operation to the other.

8 Claims, 3 Drawing Figures

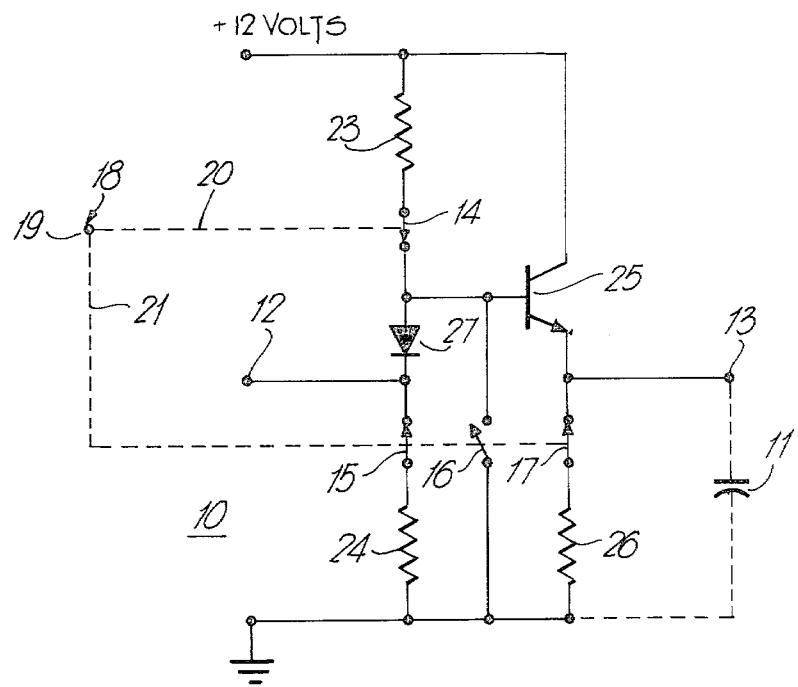
*Fig-1-*
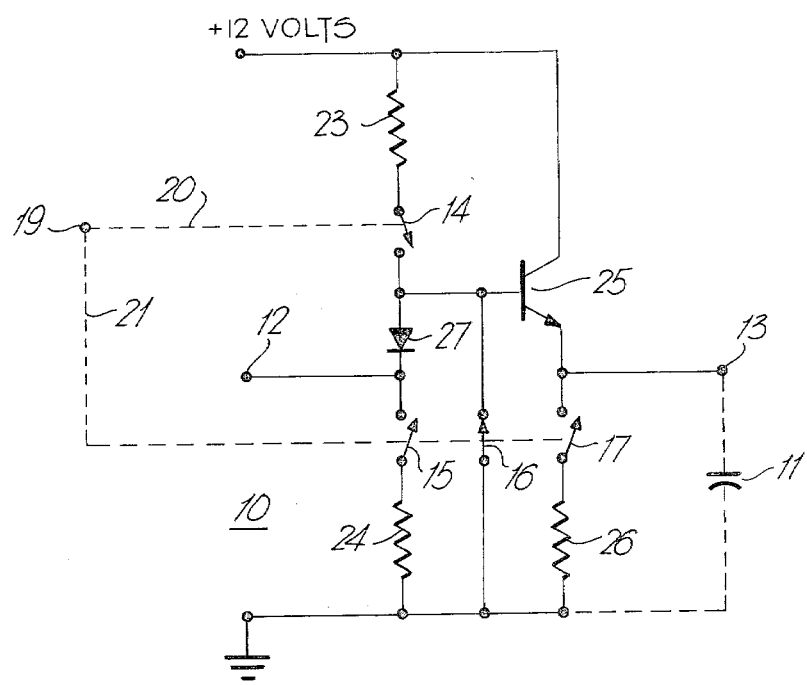
*Fig-2-*

SAMPLE-AND-HOLD CIRCUIT WITH CURRENT GAIN

This invention relates generally to sample-and-hold circuits, and more particularly to a sample-and-hold circuit that provides current gain and that is suitable for use in large scale integration (LSI) circuits.

In modern digital central office telephone switching equipment, one major problem area is the analogue to digital interface required for each telephone line. One arrangement which greatly reduces many of the problems is the use of an analogue high speed sampling switch or gate employed in conjunction with individual digital line control via one LSI (large scale intergration) integrated circuit per telephone line. Under the control of the integrated circuits, these sampling gates perform the first step of switching as well as the first time multiplexing by sampling up to about 32 line voice signals onto and from multiplexed analogue buses. Thus, one relatively complex and precise coder-decoder can be shared by approximately 100 lines through time multiplexing. A sample-and-hold circuit suitable for this purpose must have a control electrode and would preferably use standard silicon gate CMOS (complementary metal-oxide semiconductor) technology to enable it to be placed on the same integrated circuit chip as in the line logic circuitry.

Many sample-and-hold gates exist in the prior art. The following U.S. patents depict but a few of the known sample-and-hold circuits: U.S. Pat. No. 3,675,135 dated July 4, 1972 to D. R. Weller; U.S. Pat. No. 3,764,921 dated Oct. 9, 1973 to G. P. Huard; U.S. Pat. No. 3,716,800 dated Feb. 13, 1973 to J. V. DiRocco; and U.S. Pat. No. 3,638,045 dated Jan. 25, 1972 to R. S. Hughes. The problem with prior art circuits of the foregoing type is that they do not provide for current gain and they are not suitable for construction by LSI techniques.

In simplistic terms the present invention is a sample-and-hold circuit that provides current gain and that is suitable for construction according to LSI techniques. The present invention incorporates a bipolar transistor biased on (in the "sample" mode) to a predetermined quiescent state. A capacitor is connected to the output of the transistor to be charged to a certain voltage by the transistor and to store this voltage when the sample-and-hold circuit is switched to the "hold" mode of operation. During the "sample" mode of operation the voltage output of the bipolar transistor, and consequently the voltage across the capacitor, varies in a direct relationship to the input voltage to the circuit. When the sample-and-hold circuit is placed in the "hold" mode of operation, solid-state switches are caused to operate which remove the bias from the base of the transistor, isolate the capacitor from a discharge path within the sample-and-hold circuit itself, and cause an input diode to become reverse biased and thereby isolate the circuit from the normal range of input signals. In the preferred embodiment the aforementioned switches are insulated gate field effect transistors (IGFETs) and the biasing currents for biasing the bipolar transistor are also provided by IGFETs. The aforementioned diode is preferably a double collector bipolar transistor connected to operate as a diode.

Stated in other terms the present invention is a sample-and-hold circuit for receiving a signal, for charging a storage means to a voltage level representative of the magnitude of the signal, for selectively maintaining the charge on the storage means for a given period of time, and suitable for LSI implementation, the sample-and-hold circuit comprising: an input electrode for receiving the signal; an output electrode for connection to the storage means; a gate electrode for receiving a control signal which controls the alternating of the circuit between the sample mode and the hold mode; a variable impedance device, responsive to the signal appearing on the input electrode, for controlling the flow of current into the storage means via the output electrode; switch means, responsive to the control electrode, for altering the sample-and-hold circuit between the sample mode of operation and the hold mode of operation, the switch means having a first state and a second state, the first state allowing biasing currents to be applied to the variable impedance device for energizing the device into a quiescent state of conduction, the second state removing bias from the variable impedance device so that the variable impedance device is in the non-conducting state, and the storage means is isolated from any conducting portion of the circuit, so that the storage means maintains its charge for the given period of time; wherein said variable impedance device is a bipolar transistor, wherein said biasing currents are controlled by insulated gate field effect transistors, wherein said switch means comprise both a bipolar transistor and insulated gate field effect transistors, and wherein said given period of time is at least 124 micro-seconds.

Stated in yet other terms, the present invention is a sample-and-hold circuit, suitable for LSI implementation and having current gain, for receiving a voltage signal, for charging a capacitor to a voltage level representative of the magnitude of the signal, and for selectively maintaining the charge on the capacitor for a given period of time, the sample-and-hold circuit comprising: an input electrode for receiving the signal; an output electrode for connection to the capacitor; a gate electrode for receiving a control signal which causes the circuit to alternate between the sample mode and the hold mode; a bipolar transistor, having its base electrode responsive to the signal appearing on the input electrode, for controlling the flow of current into the capacitor via the output electrode; switch means comprising both a solid-state unidirectional current device and CMOS field effect transistors; the solid-state unidirectional current device connected intermediate the input electrode and the base electrode for conducting current from the input electrode to the base electrode during the sample mode, and for blocking current flow from the input electrode during the hold mode;

the CMOS field effect transistors responsive to the control signal on the control electrode for altering the sample-and-hold circuit between the sample mode of operation and the hold mode of operation and for setting the bias currents for the quiescent point of the bipolar transistor, the switch means having a first state and a second state, the first state providing biasing currents for the bipolar transistor, the second state removing bias from the bipolar transistor so that the bipolar transistor is in the non-conducting state, and the capacitor is isolated from any conducting portion of the circuit, so that the capacitor maintains its charge for the given period of time.

The invention will now be described in more detail with reference to the accompanying drawings, in which:

FIG. 1 is a greatly simplified schematic representation of the circuit of the invention in the "sample" mode;

FIG. 2 is the circuit of FIG. 1 depicted in the "hold" mode;

Figure 3:
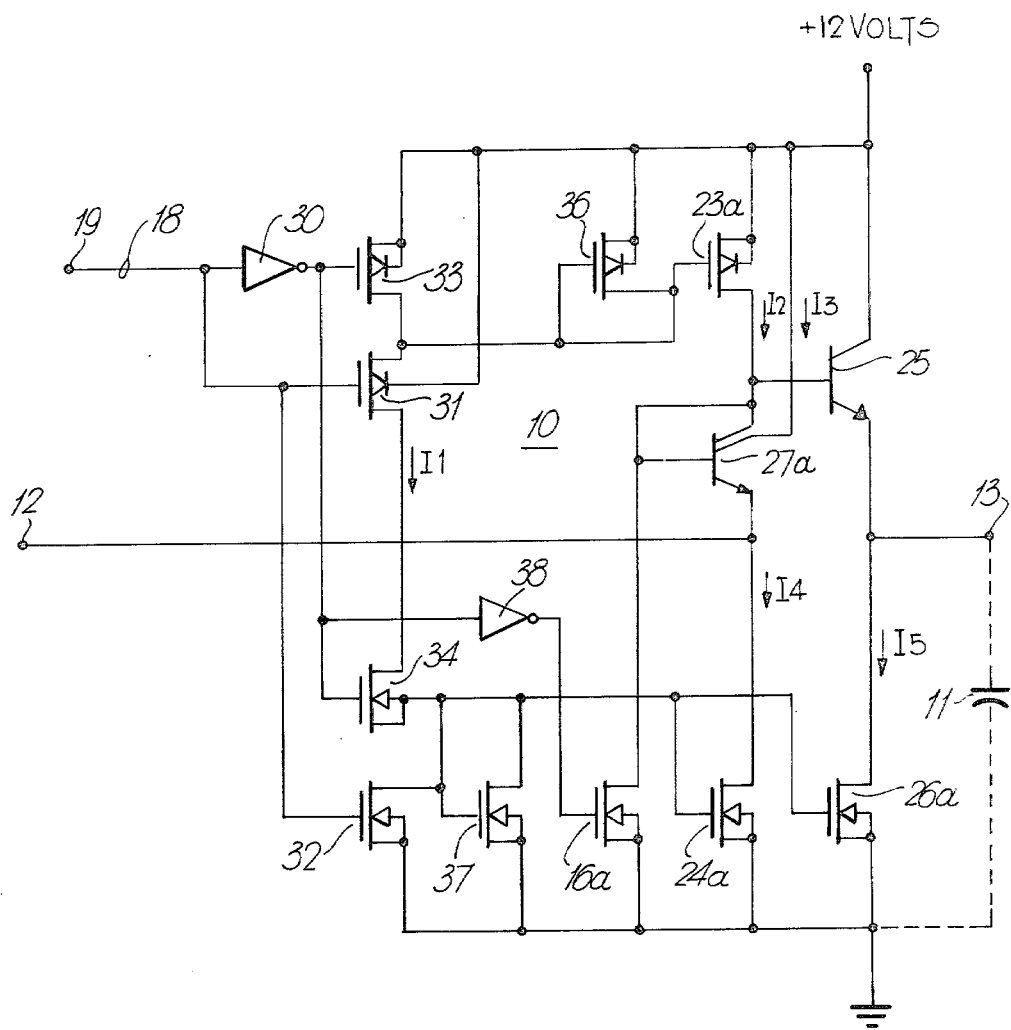
FIG. 3 is a simplified schematic of the preferred embodiment of the invention.

Turning now to FIG. 1, the components are interconnected as depicted therein and attention is directed to the Figure. FIG. 1 is a schematic of the invention, greatly simplified, in order to provide a more easily visualized circuit description. The actual schematic of the invention is shown in FIG. 3.

In the context of this disclosure FIG. 1 should be considered as consisting of sample-and-hold circuit 10, and capacitor (or storage means) 11. Sample-and-hold circuits generally include some form of a gated switching device connected between an input terminal and a holding capacitor connected to store the signals passed by the switching device. For the purposes of this disclosure, including the claims thereof, it is deemed that capacitor 11 does not form a part of sample-and-hold circuit 10 per se; it is recognized that capacitor 11 is a necessary component to complement circuit 10 and to provide the device which has the requisite storage capacity to hold sufficient voltage for useful purposes. It is furthermore recognized that such a division is not conventional. However, in the actual implementation of the circuit depicted in FIG. 1, capacitor 11 would be a discrete component, and the remainder of the circuitry indicated in FIG. 1 would preferably be fabricated as a single integrated circuit on a single "chip." In short, if circuit 10 and capacitor 11 were claimed together as a combination, a manufacturer of integrated circuits, supplying only circuit 10, would successfully circumvent the claims, and only the ultimate user who combined the circuit 10 with the capacitor 11 would infringe. It is for this reason that it is desired to describe, and to claim, the sample-and-hold circuit 10 as one entity completely separate and divorced from capacitor 11.

The operation of the FIG. 1 circuit will now be described. FIG. 1 depicts the circuit of the invention in the "sample" mode of operation. A signal which is to be periodically sampled and held is applied to input electrode 12 of the sample-and-hold circuit 10. The output signal (i.e. the signal to be stored or held) is taken from output electrode 13 and is applied across capacitor (or storage means) 11. Switches 14, 15, 16 and 17 function to alternate circuit 10 between either the sample mode of operation or the hold mode of operation. Switches 14, 15 and 17 operate in unison and are controlled in response to a gate signal 18 applied to gate electrode 19. Switch 16 also operates in response to the signal on electrode 19, but it has a small delay built into its operation, as will be explained in greater detail in connection with the description of FIG. 3. The control mechanism between gate electrode 19 and the switches 14, 15, 16 and 17 is shown symbolically in FIG. 1 by dashed lines 20 and 21. As indicated previously, the switches in FIG. 1 are positioned in the "sample" mode of operation.

A flow of current from the +12 volt supply passes through resistor 23, switch 14, diode 27, switch 15 and resistor 24 to ground (or zero) potential. This current flow forward biases diode 27 and allows the input signal applied to input electrode 12 to reach the base of transistor 25. A small portion of the current that passes through resistor 23 and switch 14 passes through the base-emitter junction of transistor 25 thereby causing transistor 25 to be biased on at a predetermined quiescent point. The magnitude of the current passed by transistor 25 varies about the magnitude of the current passed at the quiescent point in direct relationship to the magnitude of the voltage applied to input electrode 12. Capacitor 11 is consequently charged to a certain voltage level dependent upon the voltage magnitude on the emitter of transistor 25.

FIG. 2 depicts sample-and-hold circuit 10 in the hold mode of operation. The circuitry of FIG. 2 is the same as that of FIG. 1, the only difference is that in FIG. 2 the switches 14, 15, 16 and 17 are now in their alternate positions as to what they were in FIG. 1. In FIG. 2 switch 14 is open and switch 16 is closed; consequently the base of transistor 25 and the anode of diode 27 are at zero potential with the result that transistor 25 is turned off and diode 27 is non-conducting. Switch 15 is open so as to isolate input electrode 12 from resistor 24 which results in electrode 12 having a high impedance to ground potential. Switch 17 is open so as to prevent discharging capacitor 11 via resistor 26.

FIG. 3 depicts the simplified schematic of the preferred embodiment of the invention; the components are interconnected as shown in FIG. 3 and attention is directed to that Figure.

In FIG. 3, the sample-and-hold circuit 10 is caused to vary between its sample mode of operation and its hold mode of operation by the gate signal 18 applied to gate electrode 19. A DC signal having zero, or ground potential, applied to electrode 19 causes circuit 10 to be in the sample mode of operation, while a DC signal having a positive magnitude (approximately +12 volts) causes circuit 10 to be in the hold mode of operation. Inverter 30 inverts the signal appearing on electrode 19 so that when electrode 19 carries a positive signal (e.g. +12 volts), the output of inverter 30 is a signal having ground or zero potential, and when electrode 19 carries a zero potential signal, the output of inverter 30 is positive (approximately +12 volts).

The signal on electrode 19 controls, directly, the state of FETs 31 and 32. When electrode 19 carries a zero potential, FET 31 (a p-channel FET) is ON and is conducting current while FET 32 (an n-channel FET) is OFF and is not conducting current. The output signal from inverter 30 controls the state of FETs 33 and 34. When electrode 19 carries a zero potential, the output of inverter 30 is positive (approximately +12 volts) and FET 33 (a p-channel FET) is OFF and not conducting current while FET 34 (an n-channel FET) is ON and is conducting current. When electrode 19 carries a positive potential (approximately +12 volts) the output of inverter 30 is zero potential and FET 33 is ON and FET 34 is OFF.

A description of the operation of circuit 10 in the sample mode will now be commenced. In the sample mode of operation, electrode 19 carries a ground (i.e. zero) potential. This means that FETs 31 and 34 are biased ON and FETs 32 and 33 are biased OFF. Because FET 31 is ON and conducting current, FET 36 is biased on to a small degree and is conducting a small amount of current I1 (approximately 0.45 mA). After passing through FETs 36 and 31, current I1 passes through FET 34 and through FET 37. The magnitude of current I1 is established by the total impedance presented by the series combination of FETs 36, 31, 34 and 37. Because FET 36 is biased ON, the gate of FET 23a receives a positive potential and FET 23a is biased ON to a small degree. FET 23a passes a current I2 of approximately 0.65 mA (milliamperes) which is applied to one of the collectors of bipolar transistor 27a.

Transistor 27a is connected into the circuit to function as a diode, with its effective anode connected to the base of bipolar transistor 25 and its effective cathode connected to input electrode 12. Current I2 also functions to turn ON transistor 27a, and the other collector of transistor 27a draws a current I3 of approximately 1.65 mA from the positive voltage supply. A current I4 (approximately 2.25 mA) is output from the emitter of transistor 27a and passes through FET 24a which is biased on via the voltage from the drain of FET 34; the magnitude of the current carried by FET 24a is controlled by FET 37 and how much current it shunts to ground. Bipolar transistor 25 is biased on by the current passed by FET 23a, and FET 26a is biased on by the voltage appearing at the drain of FET 34, and a current I5 (approximately 9.0 mA) is passed through the series combination of transistor 25 and FET 26a. FET 37 controls how much current FET 26a conducts by controlling the flow of current from the drain of FET 34 to ground (via itself) in the same fashion as FET 24a is controlled (recall that in this mode of operation FET 32 is OFF).

FET 16a is employed to short the bases of transistors 25 and 27a to ground potential during the hold mode of operation, to thereby turn both transistors 25 and 27a OFF and therefore become non-conducting. In the sample mode currently being discussed, the ground potential an electrode 19 causes the output of inverter 30 to be positive; the positive input to inverter 38 causes it to have a ground or zero potential output, and consequently FET 16a is OFF during the sample mode of operation. The inclusion of inverter 38, rather than supplying the signal for the gate of FET 16a directly from input electrode 19, is to introduce a small time delay in the switching of FET 16a between its OFF and ON states. When circuit 10 switches from the sample mode to the hold mode, this delay prevents a negative turn-off spike from occurring on output electrode 13.

At this time the relationship between FIG. 3 and FIGS. 1 and 2 can be described. The items with common reference characters are of course the same items in each Figure. Resistor 23 and switch 14 of FIGS. 1 and 2 are implemented in FIG. 3 by FET 23a. The amount of current conducted by FET 23a is controlled by FET 36. Diode 27 of FIGS. 1 and 2 is implemented in FIG. 3 by bipolar transistor 27a. Resistor 24 and switch 15 of FIGS. 1 and 2 are implemented in FIG. 3 by FET 24a. Resistor 26 and switch 17 of FIGS. 1 and 2 are implemented in FIG. 3 by FET 26a. The current conducted by FET 26a, and also the current conducted by FET 24a are controlled by FET 37. Switch 16 of FIGS. 1 and 2 is implemented in FIG. 3 by FET 16a. FETs 31, 32, 33 and 34 of FIG. 3 are employed to control the turning on and off of the other FETs in the Figure.

In the hold mode of operation, there is a positive potential (approximately +12 volts DC) applied to gate electrode 19. This results in FET 31 being OFF and FET 32 being ON; the output of inverter 30 is zero potential with the result that FET 33 is ON and FET 34 is OFF and the output of inverter 38 is positive resulting in FET 16a being ON. The effect of FET 33 being ON and FET 31 being OFF is that FET 36 and FET 23a are both OFF with the result that current I2 is now zero (i.e. no current flows through FET 23a); additionally, because FET 31 is OFF, current I1 is now zero. Because FET 16a is turned ON, the bases of transistors 25 and 27a are both brought to approximately ground potential, and hence transistors 25 and 27a are turned OFF. The fact that FET 32 is ON while FET 34 is OFF means that the gates of FETs 37, 24a and 26a are brought to approximately ground potential with the result that FETs 37, 24a and 26a are turned OFF.

The effect of having transistor 25 biased on at a particular quiescent point, during the sample mode of operation, is that the response of circuit 10 is very quick and it results in high output drive current for charging capacitor 11. The logically switched FETs (i.e. all the FETs of FIG. 3) constitute a CMOS (complementary metal-oxide semiconductor) current mirror to set-up all the required bias currents, and the lateral collector compensating diode equivalent (i.e transistor 27a) is employed to achieve low offset voltage at output electrode 13. Transistor 25 functions as an emitter follower to achieve current gain with low noise.

The circuit of FIG. 3 has a current gain of 20 or greater during the sample mode, and has an output impedance (between electrode 13 and ground) of less than 100 ohms for an input impedance of 1000Ω. The FIG. 3 circuit has an input impedance of greater than 10,000Ω for an output load (between electrode 13 and ground) of 1,000Ω, and it has an offset voltage of less than 30 millivolts. Capacitor 11 is preferably 1,000 pF (pico-farads) and can range from 100 pF to 2,000 pF depending upon the performance characteristics desired.

When operating the circuit of FIG. 3 with capacitor 11 having a value of 1,000 pF (pico-farads), and a 100Ω output resistance from electrode 13 to ground, the voltage output (across capacitor 11) settles to approximately 0.1% of the required final value (which is of course the voltage magnitude on electrode 12) within approximately 1 microsecond of turn-on and does not change by approximately more than 20 mV upon turn-off. In a typical application of the FIG. 3 circuit, the control signal applied to control electrode 19 has a frequency of 8 KHz, the sample mode lasts for approximately 1 microsecond and the hold mode lasts for approximately 124 microseconds.

What is claimed is:

1. A sample-and-hold circuit for receiving a signal, for charging a storage means to a voltage level representative of the magnitude of said signal, for selectively maintaining the charge on said storage means for a given period of time, and suitable for LSI (large scale integration) implementation, said sample-and-hold circuit comprising:
   an input electrode for receiving said signal;
   an output electrode for connection to said storage means;
   a gate electrode for receiving a control signal which controls the alternating of said circuit between a sample mode and a hold mode;
   a variable impedance device, responsive to the signal appearing on said input electrode, for controlling the flow of current into said storage means via said output electrode;
   switch means, responsive to said gate electrode, for altering said sample-and-hold circuit between the sample mode of operation and the hold mode of operation, said switch means having a first state and a second state, said first state allowing biasing currents to be applied to said variable impedance device for energizing said device into a quiescent state of conduction, said second state removing bias from said variable impedance device so that said variable impedance device is in the non-conducting state, and said storage means is isolated from any conducting portion of said circuit, so that said storage means maintains its charge for said given period of time; and wherein said variable impedance device is a bipolar transistor, wherein said biasing currents are controlled by insulated gate field effect transistors, wherein said switch means comprise both a bipolar transistor and insulated gate field effect transistors, and wherein said given period of time is at least 124 micro-seconds.

2. A sample-and-hold circuit, suitable for LSI (large scale integration) implementation and having current gain, for receiving a voltage signal, for charging a capacitor to a voltage level representative of the magnitude of said signal, and for selectively maintaining the charge on said capacitor for a given period of time, said sample-and-hold circuit comprising:

an input electrode for receiving said signal;

an outpt electrode for connection to said capacitor;

a gate electrode for receiving a control signal which causes said circuit to alternate between a sample mode and a hold mode;

a bipolar transistor, having its base electrode responsive to the signal appearing on said input electrode, for controlling the flow of current into said capacitor via said output electrode;

switch means, comprising both a solid-state unidirectional current device and CMOS field effect transistors;

said solid-state unidirectional current device connected intermediate said input electrode and said base electrode for conducting current from said input electrode to said base electrode during the sample mode, and for blocking current flow from said input electrode during the hold mode;

said CMOS field effect transistors responsive to the control signal on said gate electrode for altering said sample-and-hole circuit between the sample mode of operation and the hold mode of operation and for setting the bias currents for the quiescent point of said bipolar tranistor, said switch means having a first state and a second state, said first state providing biasing currents for said bipolar transistor, said second state removing bias from said bipolar transistor so that said bipolar transistor is in the non-conducting state, and said capacitor is isolated from any conducting portion of said circuit, so that said capacitor maintains its charge for said given period of time; and wherein said solid state unidirectional current device is a diode.

3. The sample-and-hold circuit of claim 2 wherein said solid-state unidirectional current device is a bipolar transistor connected so as to function as a diode.

4. The sample-and-hold circuit of claim 3 or 2 wherein said given period of time is at least 124 microseconds.

5. In a gated sample-and-hold circuit, suitable for LSI implementation, and having current gain greater than unity, said circuit comprising:

an input electrode for receiving the signal to be sampled;

a capacitor for maintaining, during the hold mode of operation, a voltage level representative of the magnitude of said signal immediately prior to said hold mode of operation;

an output electrode connected to one terminal of said capacitor;

a gate electrode for receiving a control signal which causes said circuit to alternate between the sample mode of operation and the hold mode of operation;

a bipolar transistor responsive, during the sample mode of operation, to the signal appearing on said input electrode for controlling the flow of current into said capacitor;

switch means comprising both a solid-state unidirectional current device and CMOS field effect transistors;

said solid-state unidirectional current device connected intermediate said input electrode and the base electrode of said bipolar transistor so that said bipolar transistor is responsive to the signal on said input electrode during the sample mode of operation, and said bipolar transistor is not responsive to the signal on said input electrode during the hold mode of operation;

said CMOS field effect transistors being responsive to the control signal on said gate electrode for altering said sample-and-hold circuit between the sample mode of operation and the hold mode of operation and for setting bias currents for the said bipolar transistor, said switch means having a fist state and a second state, said first state providing biasing currents for said bipolar transistor, said second state removing bias from said bipolar transistor so that said bipolar transistor is in the non-conducting state, and said capacitor is isolated from any conducting portion of said circuit, so that said capacitor maintains its charge during the hold mode of operation.

6. The sample-and-hold circuit of claim 5 wherein said solid-state unidirectional current device comprises a bipolar transistor having two collectors, one of said collectors being connected to the base of said transistor to provide a diode type of operation with the base of said transistor being effectively the anode of a diode, and the emitter of said transistor being effectively the cathode of a diode.

7. The sample-and-hold circuit of claim 5 or 6 wherein the frequency of said control signal applied to said gate electrode is 8 KHz and the sample mode extends for approximately 1 microsecond.

8. The sample-and-hold circuit of claim 5 or 6 wherein the value of said capacitor can range from approximately 200 picofarads to approximately 2,000 picofarads.

* * * * *